United States Patent
Li

(10) Patent No.: US 7,791,400 B2
(45) Date of Patent: Sep. 7, 2010

(54) SQUARE-FUNCTION CIRCUIT

(75) Inventor: Qunying Li, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 205 days.

(21) Appl. No.: 12/190,280

(22) Filed: Aug. 12, 2008

(65) Prior Publication Data

US 2009/0045865 A1 Feb. 19, 2009

Related U.S. Application Data

(60) Provisional application No. 60/955,806, filed on Aug. 14, 2007.

(51) Int. Cl.
*G06G 7/20* (2006.01)

(52) U.S. Cl. ...................... 327/349; 327/346

(58) Field of Classification Search ................ 327/346, 327/349, 355, 361, 427
See application file for complete search history.

(56) References Cited

U.S. PATENT DOCUMENTS

| | | | |
|---|---|---|---|
| 6,031,408 A | 2/2000 | Flannagan | |
| 6,204,719 B1 | 3/2001 | Gilbert | |
| 6,815,997 B2 * | 11/2004 | Dathe et al. | 327/349 |
| 7,081,787 B2 * | 7/2006 | Shi et al. | 327/349 |
| 7,327,183 B2 * | 2/2008 | Gilbert | 327/349 |
| 2007/0040598 A1 * | 2/2007 | Zou | 327/349 |

FOREIGN PATENT DOCUMENTS

JP 2001-118025 A 4/2001

OTHER PUBLICATIONS

"Simple CMOS Analog Square-Rooting and Squaring Circuits". I.M. Filanovsky and H.P. Baltes, IEEE Trans. Circuits and Systems I, Apr. 1992, vol. 39, No. 4, pp. 312-315.
John M. Khoury, et al., "Sampled-Data and Continuous-Time Squarers in MOS Technology", IEEE Journal of Solid-State Circuits, vol. 25, No. 4, Aug. 1990, pp. 1032-1035.
Satoshi Sakurai and Mohammed Ismail, "A CMOS Square-Law Programmable Floating Resistor", IEEE International Symposium on Circuits and Systems, May 1993, pp. 1184-1187.
Sompong Wisetphanichkij, et al., "A Low-Voltage CMOS Current Squarer Circuit", IEEE Proceedings of ISCIT2005, Jul. 2005, pp. 262-265.
Klaas Bult and Hans Wallinga, "A Class of Analog CMOS Circuits Based on the Square-Law Characteristic of an MOS Transistor in Saturation", IEEE Journal of Solid-State Circuits, vol. sc-22, No. 3, Jun. 1987, pp. 357-365.
Klaas Bult and Hans Wallinga, "A CMOS Four-Quadrant Analog Multiplier", IEEE Journal of Solid-State Circuits, vol. sc-21, No. 3, Jun. 1996, pp. 430-435.

* cited by examiner

*Primary Examiner*—Long Nguyen
(74) *Attorney, Agent, or Firm*—Dawn V. Stephens; Wade James Brady, III; Frederick J. Telecky, Jr.

(57) ABSTRACT

A square-function circuit includes an input field-effect transistor (FET) having a gate that is driven by an input voltage and is configured to conduct an output current. The circuit also includes a feedback circuit coupled to a source of the input FET, the feedback circuit being configured to drive a source of the input FET based on the output current to set a magnitude of the output current to be substantially equal to a square of the input voltage.

20 Claims, 6 Drawing Sheets

FIG. 4
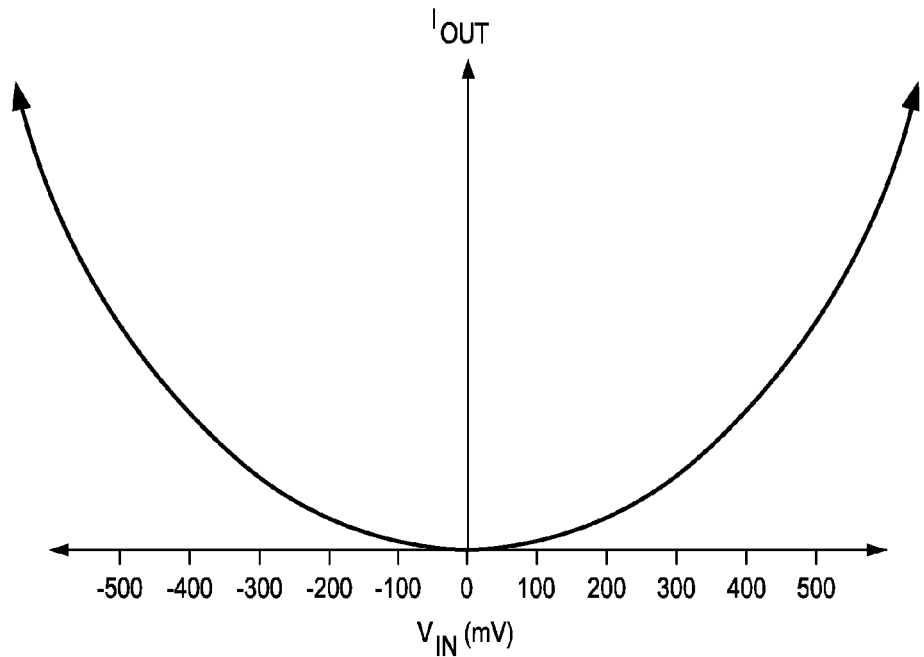
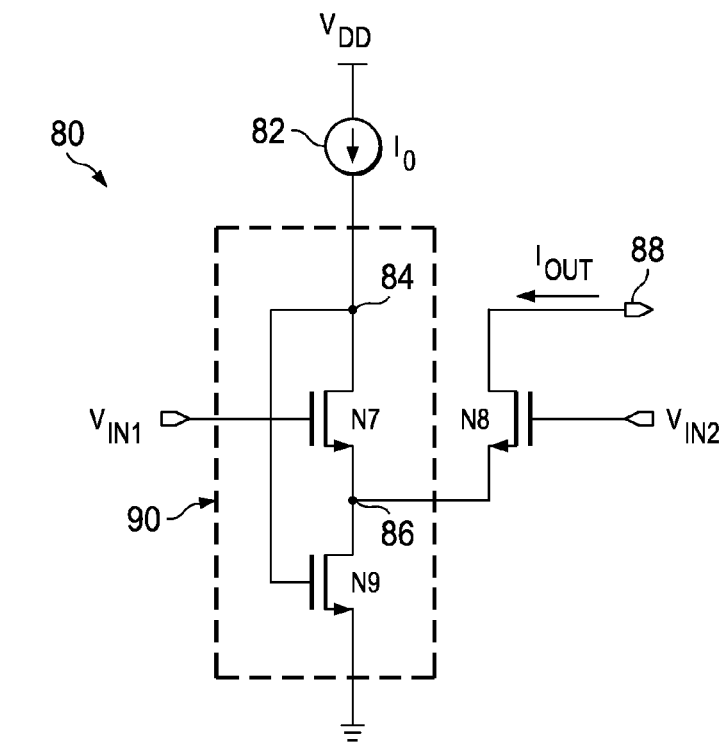
FIG. 5

SQUARE-FUNCTION CIRCUIT

RELATED APPLICATIONS

This application claims the benefit to U.S. Provisional Application No. 60/955,806, filed Aug. 14, 2007, and entitled "CMOS SQUARE CELLS," the entire contents of which is incorporated herein by reference.

TECHNICAL FIELD

This invention relates to electronic circuits, and more specifically to a square-function circuit.

BACKGROUND

A great many varieties of circuits and circuit components are implemented in electronic devices to provide specific functionality. One such type of circuit includes circuits that can perform mathematical functionality on signals, such as to perform exponential functions. As an example, a circuit that can perform a square-function on an input signal can be implemented in any of a variety of devices. Examples of devices that can implement one or more square function circuit include a power detector that can convert a root-mean-square signal magnitude to a direct current (DC) signal, a power equalizer, and a sine-wave frequency doubler to name a few.

SUMMARY

One embodiment of the present invention includes a square-function circuit. The circuit includes an input field-effect transistor (FET) having a gate that is driven by an input voltage and is configured to conduct an output current. The circuit also includes a feedback circuit that is configured to drive a source of the input FET based on the output current to set a magnitude of the output current to be substantially equal to a square of the input voltage.

Another embodiment of the invention includes a square-function circuit. The circuit includes a first FET configured to conduct a bias current in response to a first input voltage to set a source voltage of the first FET. The circuit also includes a second FET configured to conduct an output current in response to a second input voltage. The circuit further includes a feedback loop having a first input coupled to a source of the first FET and a second input coupled to a source of the second FET, the feedback loop configured to drive a source of the second FET to control the output current to have a magnitude that is a square of a difference between the first input voltage and the second input voltage.

Another embodiment of the invention includes a square-function circuit. The circuit includes a first circuit portion comprising a first FET configured to conduct a first bias current in response to a first input voltage applied at a gate thereof and a second FET having a source voltage that is set based at least in part on the first bias current. The second FET can be configured to conduct a first current through the second FET in response to a second input voltage being greater than the first input voltage. The circuit also includes a second circuit portion comprising a third FET configured to conduct a second bias current in response to the second input voltage being applied at a gate thereof and a fourth FET having a source voltage that is set based at least in part on the second bias current. The fourth FET can be configured to conduct a second current through the fourth FET in response to the first input voltage being greater than the second input voltage. An output current is provided as a sum of the first output current and the second output current and having a magnitude that is substantially equal to a square of a difference between the first input voltage and the second input voltage.

BRIEF DESCRIPTION OF THE DRAWINGS

FIG. 4 illustrates an example of a graph plotting voltage versus current for a square-function circuit in accordance with an aspect of the invention.

FIG. 5 illustrates another example of a square-function circuit in accordance with an aspect of the invention.

DETAILED DESCRIPTION

The present invention relates to electronic circuits, and more specifically to a square-function circuit. A square-function circuit can be configured to receive an input voltage and to generate an output current having a magnitude that is substantially equal to a square (e.g., a power of two) of the input voltage. As used herein in describing a mathematical relationship between parameters, the term "substantially" is intended to convey that the circuit is designed to have the described relationship between parameters but differences between the described relationship can exist, such as due to process and temperature variations. Such differences further may vary according to fabrication techniques and process conditions, but based on simulation typically fall within about ±3% of the expected value over a range of inputs. The input voltage can be a differential input signal, such that the output current can have a magnitude that is substantially equal to a square of a difference between two signals that form the differential input signal.

Figure 1:
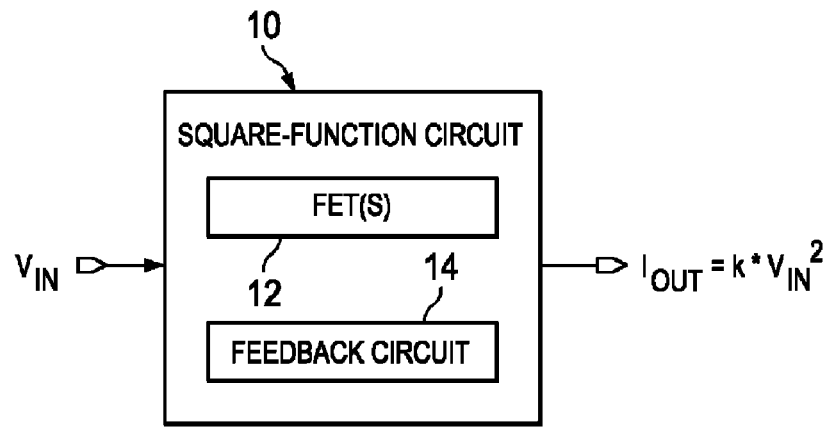
FIG. 1 illustrates an example of a diagram of a square-function circuit in accordance with an aspect of the invention.

FIG. 1 illustrates an example of a diagram of a square-function circuit 10 in accordance with an aspect of the invention. As demonstrated in the example of FIG. 1, the square-function circuit 10 is configured to implement a square-function, such that it receives an input voltage $V_{IN}$ and generates an output current $I_{OUT}$ that is functionally related to a square of the input voltage $V_{IN}$. The square-function circuit 10 generates the output current $I_{OUT}$ at a magnitude of $(k*V_{IN}^2)$, where k is a constant that can correspond to, for example, current flow characteristics of a FET. The input voltage $V_{IN}$ could be a differential voltage, such that the magnitude of the output current $I_{OUT}$ could be a square of a difference of the input voltage magnitudes. The square-function circuit 10 can be implemented in any of a variety of electronic devices to provide the square-function on a signal, such as in a power detector, a power equalizer, or a sine-wave frequency doubler. The square-function circuit 10 can be manufactured to include field-effect transistors (FETs), such as in a CMOS process. Therefore, the square-function circuit 10 can be manufactured as part of one or more additional CMOS circuits, such as could result in significant space and cost savings.

The square-function circuit 10 includes at least one field-effect transistor (FET) 12. One of the FET(S) 12 can include a first FET that conducts the output current $I_{OUT}$ in response to the input voltage $V_{IN}$ and a feedback circuit 14 that is configured to drive a source of the first FET. As an example, the feedback circuit 14 can be include an operational transconductance amplifier that has one input coupled to the source of the first FET and another input coupled to a second FET of the FET(S) 12, with an output that drives a gate of a third FET of the FET(S) 12. As a result, the feedback circuit 14 can provide a low-impedance output to the source of the first FET to set the source voltage of the first FET substantially equal to a source of the second FET, such that the output current is provided as a square function of the input voltage $V_{IN}$.

As another example, the square-function circuit can include first and second FETs coupled together at their respective sources. A feedback circuit 14 can include a third FET that has a bias set by the output current to maintain a current flow through the third FET that is substantially equal to a sum of the output current and a bias current that drives the source of the first FET. Accordingly, by implementing transistors that are substantially matched to operate substantially independent of process and temperature variations with respect to each other, the output current (e.g., $I_{OUT}=k*I_{IN}^2$), can be provided substantially independent of a threshold voltage of the first FET.

Figure 2:
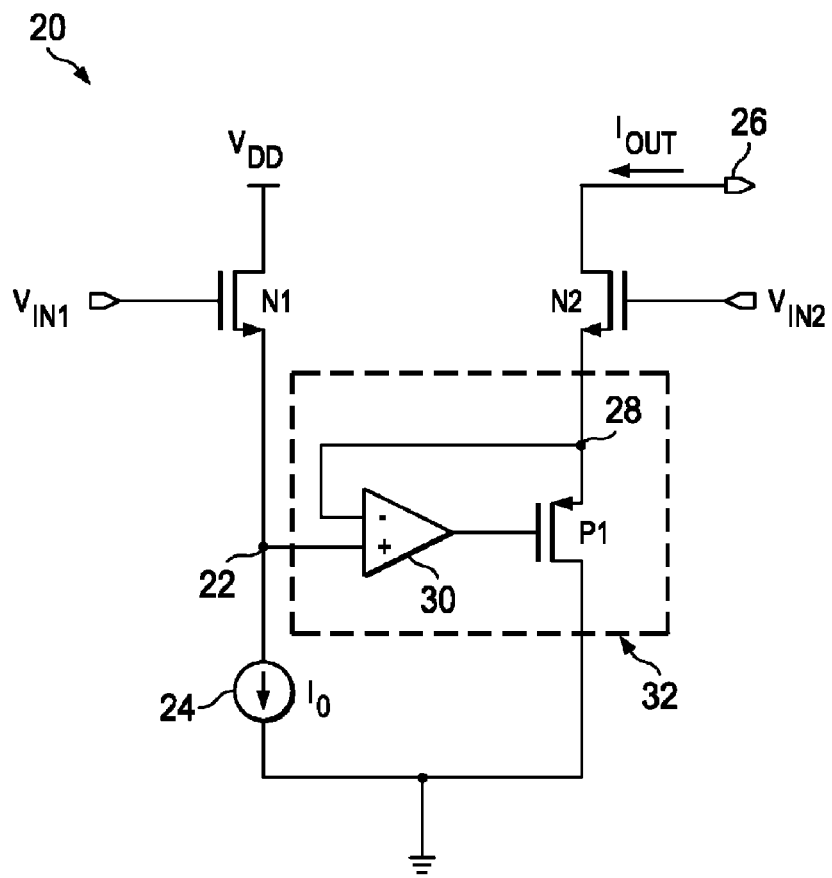
FIG. 2 illustrates an example of a square-function circuit in accordance with an aspect of the invention.

FIG. 2 illustrates an example of a square-function circuit 20 in accordance with an aspect of the invention. The square-function circuit 20 can provide an output current $I_{OUT}$ having a magnitude that is a square-function of an input voltage $V_{IN}$. The square-function circuit 20 includes a first N-type input FET N1 that is driven by a first input voltage $V_{IN1}$ at a gate and a second N-type input FET N2 that is driven by a second input voltage $V_{IN2}$ at a gate. As an example, the input voltages $V_{IN2}$ and $V_{IN1}$ can collectively form a differential input voltage $V_{IN}$ (e.g., balanced relative to a common mode voltage $V_{CM}$, where $V_{CM}=(V_{IN2}+V_{IN1})/2$). The first and second input FETs N1 and N2 can be matched FETS, such that they operate substantially the same with respect to process and temperature variations. In addition, the matched first and second input FETs N1 and N2 can have a substantially equal gate size (i.e., W/L ratio). The first input FET N1 interconnects a positive voltage $V_{DD}$ at a drain and a node 22 at a source. A current source 24 conducts a bias current $I_0$ from the node 22 to a voltage less than the positive voltage $V_{DD}$, demonstrated in the example of FIG. 2 as ground.

The second input FET N2 has a drain coupled to an output 26 from which the output current $I_{OUT}$ flows through the input FET N2. The second input FET N2 has a source at a node 28. A source of a P-type FET P1 is coupled to the node 28 and a drain of the FET P1 is coupled to ground. The FET P1 is driven at a gate by an output of an operational transconductance amplifier (OTA) 30. The OTA 30 has a non-inverting input coupled to the node 22 and an inverting input at the node 28. The OTA 30 and the FET P1 form a feedback circuit 32 that is utilized to drive the source of the second input FET N2.

The bias current $I_0$ flows through the first input FET N1 to set a source voltage of the first input FET N1 to be about equal to the gate voltage of the first input FET N1 minus the threshold voltage of the first input FET N1. The source voltage of the first input FET N1 can be expressed by the following equations:

$$V_{S,N1} = V_{G,N1} - V_{th,N1} \quad \text{Equation 1}$$

Where: $V_{S,N1}$ is the source voltage of the first input FET N1;

$V_{G,N1}$ is the gate voltage of the first input FET N1; and
$V_{th,N1}$ is the threshold voltage of the first input FET N1.

Therefore, Equation 1 can be rewritten as follows:

$$V_{22} = V_{IN1} - V_{th,N1} \quad \text{Equation 2}$$

Where: $V_{22}$ is the voltage at the node 22.

The feedback circuit 32 is configured to buffer the voltage potential at the node 22 to drive the source of the second input FET N2. The output current $I_{OUT}$ flows through the second input FET N2 at a magnitude that is set based on the magnitude of the second input voltage $V_{IN2}$ and the magnitude of the source voltage of the second input FET N2. Specifically, the output impedance of the feedback circuit 32 can be expressed as follows:

$$Z_{FB} = \frac{\frac{1}{g_{m,P1}}}{1+A} \quad \text{Equation 3}$$

Where: $Z_{FB}$ is the output impedance of the feedback circuit 32;
$g_{m,P1}$ is the transconductance of the FET P1; and
A is the gain of the OTA 30.

The input impedance at the source of the second input FET N2 can be expressed as follows:

$$Z_{N2} = \frac{1}{g_{m,N2}} \quad \text{Equation 4}$$

where: $Z_{N2}$ is the input impedance at the source of the second input FET N2;
$g_{m,N2}$ is the transconductance of the second input FET N2.

It is to be understood that the input impedance at the source of the second input FET N2 can be much greater than the output impedance of the feedback circuit 32. The feedback circuit 32 buffers the voltage at the node 22 (i.e., the source voltage of the first input FET N1) to drive the source of the second input FET N2, which can be expressed as follows:

$$V_{28} = \frac{Z_{N2}}{Z_{FB}+Z_{N2}} * V_{22} \quad \text{Equation 5}$$

Where: $V_{28}$ is the voltage potential at the node 28.

Therefore, substituting Equations 3 and 4 into Equation 5 results in the following expression:

$$V_{28} = \frac{\frac{1}{g_{m,N2}}}{\frac{\frac{1}{g_{m,P1}}}{1+A} + \frac{1}{g_{m,N2}}} * V_{22} \quad \text{Equation 6}$$

However, for a very large value of the gain A of the OTA 30, the output impedance $Z_{FB}$ of the feedback circuit 32 is about equal to zero. Therefore, Equations 5 and 6 can be rewritten such that $V_{28} \approx V_{22}$. Accordingly, the feedback circuit 32 is configured to set the source voltage of the second input FET N2 to be about equal to the source voltage of the first input FET N1.

As described above, the voltage potential at the nodes 22 and 28 are substantially equal. As also described above, the first and second input FETs N1 and N2 can be matched FETs, such that they operate substantially the same with respect to process and temperature variations. As a result of the first and second input FETs N1 and N2 being matched, the threshold voltages are fixed by process, $V_{th,N2} = V_{th,N1}$. Thus it can be shown that the source voltage of the second input FET can be expressed as follows:

$$V_{S,N2} = V_{28} \approx V_{22} = V_{IN1} - V_{th,N1} = V_{IN1} - V_{th,N2} \quad \text{Equation 7}$$

Accordingly, based on the matching of the first and second input FETs N1 and N2 and based on the buffering of the voltage at the node 22 by the feedback circuit 32 to drive the voltage at the node 28, the dependence of the output current $I_{OUT}$ on the threshold voltage of the second input FET N2 is effectively cancelled. Therefore, the output current $I_{OUT}$ has a magnitude that is substantially independent of the threshold voltage of the second input FET N2. For example, the magnitude of the output current $I_{OUT}$ can be expressed as follows:

$$I_{OUT} = k_{N2} * \left(\frac{W}{L}\right)_{N2} * (V_{G,N2} - V_{S,N2} - V_{th,N2})^2 \quad \text{Equation 8}$$

Where: $k_{N2}$ is a constant associated with the second input FET N2; and $$\left(\frac{W}{L}\right)_{N2}$$

is the gate dimension of the second input FET N2.

From Equations 7 and 8, it can be shown that the output current $I_{OUT}$ can be expressed as follows:

$$I_{OUT} = k_{N2} * \left(\frac{W}{L}\right)_{N2} * (V_{IN2} - V_{IN1} + V_{th,N2} - V_{th,N2})^2 \quad \text{Equation 9}$$

$$I_{OUT} = k_{N2} * \left(\frac{W}{L}\right)_{N2} * (V_{IN2} - V_{IN1})^2 \quad \text{Equation 10}$$

Therefore, Equation 10 demonstrates that the dependence of the output current $I_{OUT}$ on the threshold voltage of the second input FET N2 is effectively cancelled, such that the output current $I_{OUT}$ is independent of the threshold voltage of the second input FET N2. Accordingly, the output current $I_{OUT}$ is a square-function of a difference between the first and second input voltages $V_{IN1}$ and $V_{IN2}$, respectively.

It is to be understood that the square-function circuit 20 is not intended to be limited to the example of FIG. 2. As an example, the square-function circuit 20 can be arranged such that the first and second input FETs N1 and N2 could be configured as P-type FETs, the FET P1 could be configured as an N-type FET, and the current source 24 could conduct the bias current $I_0$ from the positive rail voltage $V_{DD}$.

The square-function circuit 20 thus takes advantage of the square-law of metal-oxide semiconductor field-effect transistors (MOSFETs) (i.e., strong inversion) resulting from operating the second input FET N2 in the saturation region (e.g., the FET N2 operates in strong inversion if $V_{IN2}$ is at least a few hundred mV higher than Vin1). However, upon the second input voltage $V_{IN2}$ having a magnitude within a threshold relative to the first input voltage $V_{IN1}$ (e.g., less than a few hundred mV), the square-function circuit 20 can exhibit error based on the second input FET N2 operating in the sub-threshold voltage region (e.g., the sub-threshold region being also known as weak inversion region). Specifically, the current varies exponentially with gate-to-source bias $V_{GS}$ during the weak inversion mode of operation for the second input FET N2 which can result in error in the output current $I_{OUT}$ as a deviation from the square-function. Additionally, in the example of FIG. 2, the output current $I_{OUT}$ can be substantially cut-off based on a magnitude of the second input voltage $V_{IN2}$ being less than a magnitude of the first input voltage $V_{IN1}$. Specifically, because the first and second input FETs N1 and N2 have substantially equal source voltage potentials, a magnitude of the second input voltage $V_{IN2}$ of less than the first input voltage $V_{IN1}$ sets a gate-source voltage magnitude of the second input FET N2 to be less than the threshold voltage of the second input FET N2.

Figure 3:
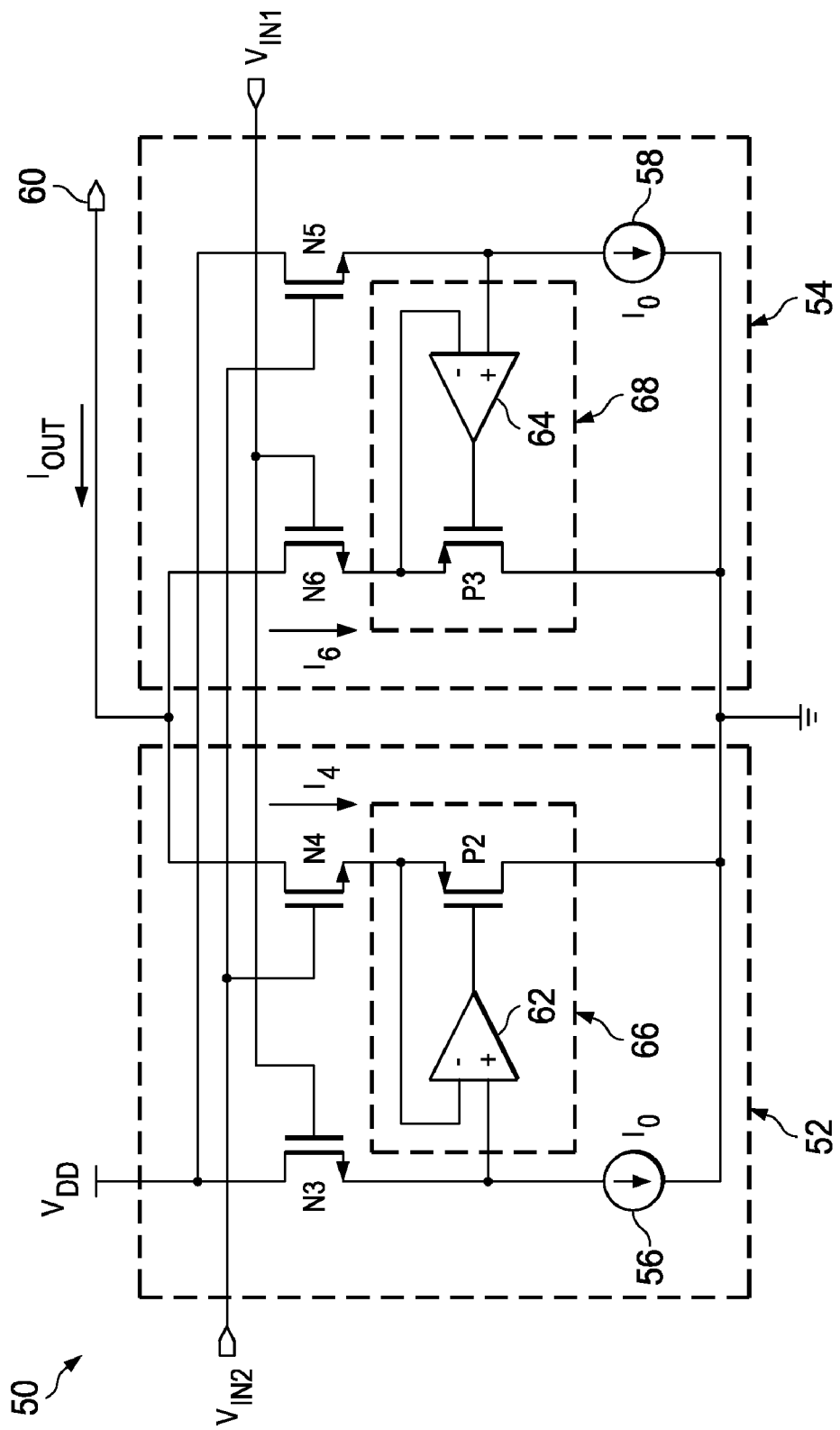
FIG. 3 illustrates an example of a two-quadrant square-function circuit in accordance with an aspect of the invention.

FIG. 3 illustrates an example of a two-quadrant square-function circuit 50 in accordance with an aspect of the invention. The square-function circuit 50 is configured to generate an output current $I_{OUT}$ having a magnitude that is substantially equal to a square of a difference between a first input voltage $V_{IN1}$ and a second input voltage $V_{IN2}$.

The square-function circuit 50 includes a first portion 52 and a second portion 54. Each of the first portion 52 and the second portion 54 are configured substantially similar to the square-function circuit 20 in the example of FIG. 2. Specifically, the first portion 52 includes a first N-type input FET N3 that is driven by the first input voltage $V_{IN1}$ and a second N-type input FET N4 that is driven by the second input voltage $V_{IN2}$. The first portion 52 also includes a first current source 56 that conducts a bias current $I_0$ from a source node of the first input FET N3 to a low voltage, demonstrated in the example of FIG. 3 as ground. The second input FET N4 is coupled at a drain to an output 60 from which the output current $I_{OUT}$ flows through the second input FET N4. The first portion 52 further includes a P-type FET P2 that interconnects a source node of the second input FET N4 with ground. The FET P2 is driven at a gate by an OTA 62 that is coupled at respective inputs to the source nodes of the first and second input FETs N3 and N4. Therefore, the OTA 62 and the FET P2 collectively form a feedback circuit 66, similar to as described above in the example of FIG. 2.

Likewise, the second portion 54 includes a third N-type input FET N5 that is driven by the second input voltage $V_{IN2}$ at its gate and a fourth N-type input FET N6 that is driven by the first input voltage $V_{IN2}$ at its gate. The second portion 54 also includes a second current source 58 that conducts a bias current $I_0$ from a source node of the third input FET N5 to ground. The fourth input FET N6 is coupled at a drain to the output 60 from which the output current $I_{OUT}$ flows through the fourth input FET N6. The second portion 54 further includes a P-type FET P3 that interconnects a source node of the fourth input FET N6 with ground. The FET P3 is driven at a gate by an OTA 64 that is coupled at respective inputs to the source nodes of the third and fourth input FETs N5 and N6. Therefore, the OTA 64 and the FET P3 collectively form a feedback circuit 68. The input FETs N3, N4, N5, and N6 can all be matched FETs, similar to as described above in the example of FIG. 2.

Each of the first and second portions 52 and 54 of the square-function circuit 50 individually operate substantially the same as the square-function circuit 20 in the example of FIG. 2. However, the first and second portions 52 and 54 of the square-function circuit 50 collectively operate such that the output current $I_{OUT}$ is provided as a square of the difference between the first and second input voltages $V_{IN1}$ and $V_{IN2}$ regardless of the relative magnitude of the first and second input voltages $V_{IN1}$ and $V_{IN2}$. For example, upon the second input voltage $V_{IN2}$ having a magnitude that is substantially greater than the first input voltage $V_{IN1}$ (e.g., greater than a few hundred mV), the first portion 52 of the square-function circuit 50 is activated to conduct a current $I_4$ that is equal to the output current $I_{OUT}$ and the second portion 54 of the square-function circuit 50 is deactivated. As a result, the second input FET N4 conducts substantially all of the output current $I_{OUT}$ as a square-function of the difference between the first and second input voltages $V_{IN1}$ and $V_{IN2}$. Upon the first input voltage $V_{IN1}$ having a magnitude that is substantially greater than the second input voltage $V_{IN2}$ (e.g., greater than a few hundred mV), the second portion 54 of the square-function circuit 50 is activated to conduct a current $I_6$ that is equal to the output current $I_{OUT}$ and the first portion 52 of the square-function circuit 50 is deactivated. As a result, the fourth input FET N6 conducts substantially all of the output current $I_{OUT}$ as a square-function of the difference between the first and second input voltages $V_{IN1}$ and $V_{IN2}$.

As a further example, if an absolute value of the difference between the first and second input voltages $V_{IN1}$ and $V_{IN2}$ is less than a threshold magnitude (e.g., less than a few hundred mV), then the second and fourth input FETs N4 and N6 conduct the currents $I_4$ and $I_6$ that are each a portion of the output current $I_{OUT}$ in a weak inversion mode. In the weak inversion mode (e.g., sub-threshold mode such as if $V_{GS} < V_{th}$), the currents $I_4$ and $I_6$ vary exponentially with respect to a respective gate/source voltage $V_{GS}$. However, the output current $I_{OUT}$, as a sum of the sub-threshold current flow through each of the second and fourth input FETs N4 and N6 remains at a magnitude that still approximates a square of a difference between the first and second input voltages $V_{IN1}$ and $V_{IN2}$. Specifically, the aggregate output current $I_{OUT}$ can be expressed as follows:

$$I_{OUT} = I_4 + I_6 \quad \text{Equation 11}$$

$$I_{OUT} = I_S \exp\left(\frac{V_{GS,N4}}{nV_T}\right) + I_S \exp\left(\frac{V_{GS,N4}}{nV_T}\right) \quad \text{Equation 12}$$

$$I_{OUT} = I_S \exp\left(\frac{V_{IN2} - V_{IN1}}{nV_T}\right) + I_S \exp\left(\frac{V_{IN1} - V_{IN2}}{nV_T}\right) \quad \text{Equation 13}$$

$$I_{OUT} \approx I_S \left(2 + \left(\frac{V_{IN2} - V_{IN1}}{nV_T}\right)^2\right) \quad \text{Equation 14}$$

Where: $I_4$ is the current flow through the second input FET N4;

$I_6$ is the current flow through the fourth input FET N6;

$V_{GS,N4}$ is the gate/source voltage of the second input FET N4;

$V_{GS,N6}$ is the gate/source voltage of the fourth input FET N6;

$I_S$ is the source current flow through a FET at $V_{GS} = V_{th}$;

n>1 is a process related non-ideality factor; and $V_T$ is equal to kT/q.

Accordingly, Equations 11-14 demonstrate that, although each of the second and fourth input FETs N4 and N6 exhibits exponential dependence on a gate/source voltage $V_{GS}$ individually, they collectively exhibit square dependence on the first and second input voltages $V_{IN1}$ and $V_{IN2}$ to generate the output current $I_{OUT}$. The individual current provided by each of the two portions 52 and 54 of the square-function circuit 50 thus provides an aggregate current consistent with the desired square function.

It is to be understood that the square-function circuit 50 is not intended to be limited to the example of FIG. 3. As an example, the first through fourth input FETs N3 through N6 could be configured as P-type FETs, the FETs P2 and P3 could be configured as N-type FETs, and the current sources 56 and 58 could conduct the bias current $I_0$ from the positive rail voltage $V_{DD}$.

FIG. 4 illustrates an example of a graph 70 plotting voltage versus current in accordance with an aspect of the invention. The graph 70 can correspond to the square-function capability of the two-quadrant square-function circuit 50 in the example of FIG. 3. Specifically, the current demonstrated by the graph 70 is the output current $I_{OUT}$, and the input voltage $V_{IN}$ demonstrated by the graph 70 is a difference between the first and second input voltages $V_{IN1}$ and $V_{IN2}$ in the example of FIG. 3. Accordingly, the graph 70 demonstrates that the square-function circuit 50 can provide the output current $I_{OUT}$ as a square-function, regardless of the relative magnitudes of the first and second input voltages $V_{IN1}$ and $V_{IN2}$.

FIG. 5 illustrates another example of a square-function circuit 80 in accordance with an aspect of the invention. The square-function circuit 80 can provide an output current $I_{OUT}$ having a magnitude that is a square-function of an input voltage $V_{IN}$.

The square-function circuit 80 includes a first N-type input FET N7 that is driven by a first input voltage $V_{IN1}$ at a gate and a second N-type input FET N8 that is driven by a second input voltage $V_{IN2}$ at a gate thereof. As an example, the input voltages $V_{IN2}$ and $V_{IN1}$ can collectively form a differential input voltage $V_{IN}$, where $V_{IN} = V_{IN2} - V_{IN1}$. The first and second input FETs N7 and N8 can be matched FETs, such that they operate substantially the same with respect to process and temperature variations. In addition, the first and second input FETs N7 and N8 can have substantially equal sized gates (i.e., W/L ratio). The square-function circuit 80 includes a current source 82 that conducts a bias current $I_0$ from a positive voltage $V_{DD}$ to a node 84 corresponding to the drain of the first input FET N7. A drain of the first input FET N7 is coupled to the node 84 and a source of the first input FET N7 is coupled to a node 86.

The second input FET N8 is coupled at a drain to an output 88 from which the output current $I_{OUT}$ flows through the input FET N8. A source of the second input FET N8 is coupled to the node 86, such that the first input FET N7 and the second input FET N8 have source terminals that are coupled together. The square-function circuit 80 also includes an N-type FET N9 having a drain that is coupled to the node 86 and to a low voltage, demonstrated in the example of FIG. 5 as ground. The FET N9 has a gate that is coupled to the node 84. The first input FET N7 and the FET N9 collectively form a feedback circuit 90 with respect to the node 86, which drives the source of the FET N8.

As described above, the source terminals of both the first input FET N7 and the second input FET N8 are coupled together. Therefore, the first and second input FETs N7 and N8 have a common source voltage. Additionally, by matching the first and second input FETs N7 and N8, the dependence of the output current $I_{OUT}$ on the threshold voltage of the second input FET N8 is effectively cancelled, similar to as demonstrated in the example of Equations 7-10 above. As a result, the output current $I_{OUT}$ has a magnitude that is substantially independent of the threshold voltage of the second input FET N8.

The feedback circuit 90 is configured to drive the source of the second input FET N8 to maintain the flow of the output current $I_{OUT}$ through the second input FET N8 and the FET N9 to ground. The square-function circuit 80 is configured to maintain an equilibrium state of a fixed current path from the positive voltage $V_{DD}$ to ground. The current from the drain to the source of the second input FET N8 (which is the current injected to node 86) flows out of node 86 through the FET N9 to ground. By way of example, suppose the current from the drain to the source of FET N8 (i.e. the current injected into node 86) is not completely sunk by FET N9, the voltage potential of node 86 would charge up accordingly. Then, for a certain gate voltage of FET N7, the gate-to-source voltage ($V_{GS}$) of FET N7 is relatively reduced. As the result, the current flow from drain to the source of FET N7 (i.e. the current flow out of node 84) is relatively decreased but the current flow into the node 84 is fixed due to the current source $I_O$. Therefore, the voltage potential at node 84 is charged up (with some gain compared to the node 86 potential rises), which results in the gate of FET N9 become relatively higher to sink more current from node 86 to ground. Thus, the loop 90 forces any current injected from FET N8 into node 86 is sunk by FET N9, making node 86 a virtual ground node. The virtual ground means that the node 86 potential is kept a relatively constant regardless of whether some current is injected into or flows out from node 86, such that the equilibrium state is maintained. The voltage potential of node 86 can be determined by the following equations:

$$I_o = k'\left(\frac{W}{L}\right)_{N7}(V_{IN1} - V_{S,N7} - V_{th,N7})^2 \qquad \text{Equation 15}$$

which can be rewritten as follows:

$$V_{node86} = V_{S,N7} = V_{IN1} - V_{th,N7} + \sqrt{\frac{I_0}{k'\left(\frac{W}{L}\right)_{N7}}}. \qquad \text{Equation 16}$$

If FET N7 is biased in a moderate inversion region with low current $I_O$, the above Equation 16 can be interpreted as $V_{node86} = V_{S,N7} = V_{IN1} - V_{th,N7}$ with some minor error. The output impedance of the loop 90 is $$\frac{\frac{1}{g_{m,N7}}}{1+A}$$

(where A is the gain of loop 90 and A is usually large), which is much smaller than the input impedance at the source of FET N8 $\left(\frac{1}{g_{m,N8}}\right)$.

Due to the relatively smaller output impedance of the loop 90 relative to the input impedance at the source of FET N8, the source potential of FET N8 is driven to be about the same potential of node 86, which can be expressed as follows:

$$V_{S,N8} = V_{node86} = V_{S,N7} = V_{IN1} - V_{th,N7}. \qquad \text{Equation 17}$$

Then similar to Equations 8 to 10, the current $I_{OUT}$ flowing through FET N8 can be expressed as follows:

$$I_{OUT} = k_{N8} * \left(\frac{W}{L}\right)_{N8} * (V_{G,N8} - V_{S,N8} - V_{th,N8})^2 \qquad \text{Equation 18}$$

where: $k_{N8}$ is a constant associated with the second input FET N8; and $$\left(\frac{W}{L}\right)_{N8}$$

is the gate dimension of the second input FET N8.

Since, from the above discussion in this paragraph, where Equation 17 demonstrates that $V_{S,N8} = V_{IN1} - V_{th,N7}$, it can be shown that the output current $I_{OUT}$ can be expressed as follows:

$$I_{OUT} = k_{N8} * \left(\frac{W}{L}\right)_{N8} * (V_{IN2} - V_{IN1} + V_{th,N7} - V_{th,N8})^2 \qquad \text{Equation 19}$$

$$I_{OUT} = k_{N8} * \left(\frac{W}{L}\right)_{N8} * (V_{IN2} - V_{IN1})^2. \qquad \text{Equation 20}$$

It is to be understood that the square-function circuit 80 is not intended to be limited to the example of FIG. 5. As an example, similar to the square-function circuit 20 in the example of FIG. 2, the square-function circuit 80 can be inverted. Specifically, the first and second input FETs N7 and N8, as well as the FET N9 can be configured as P-type FETs, and the current source 82 could conduct the bias current $I_0$ to ground.

Similar to as described above regarding the square-function circuit 20 in the example of FIG. 2, the square-function circuit 80 in the example of FIG. 5 can generate the output current $I_{OUT}$ having a magnitude that is distorted from the expected square-function if the second input FET N8 operates in a weak inversion mode based on the relative magnitudes of the first and second input voltages $V_{IN1}$ and $V_{IN2}$. Specifically, the square-function circuit 80 can operate under the exponential-law upon the second input voltage $V_{IN2}$ being within a threshold of the first input voltage $V_{IN1}$ (e.g., less than a few hundred mV). In addition, the output current $I_{OUT}$ can be substantially deactivated based on a magnitude of the second input voltage $V_{IN2}$ being less than or equal to a magnitude of the first input voltage $V_{IN1}$.

Figure 6:
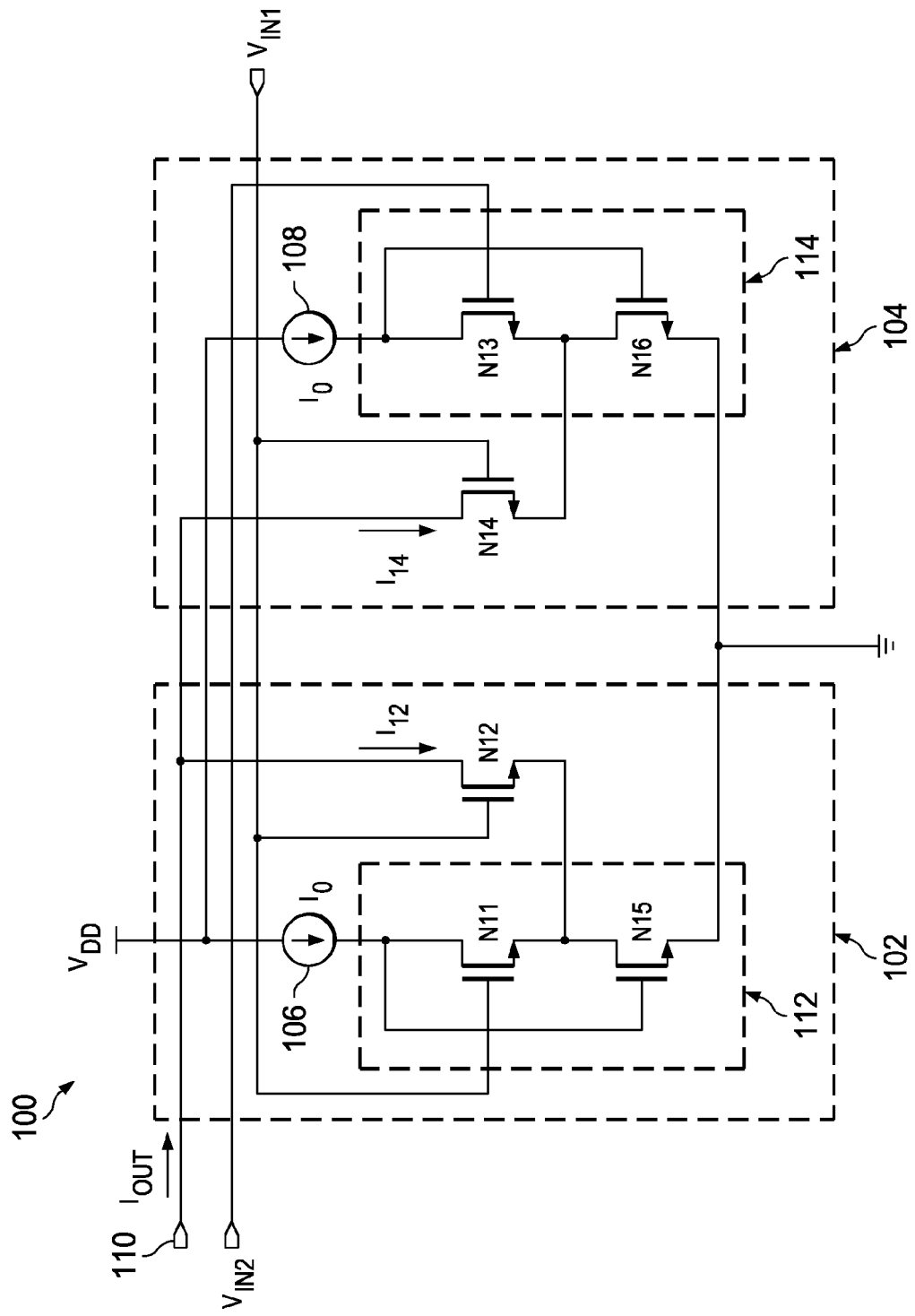
FIG. 6 illustrates another example of a two-quadrant square-function circuit in accordance with an aspect of the invention.

FIG. 6 illustrates another example of a two-quadrant square-function circuit 100 in accordance with an aspect of the invention. The square-function circuit 100 is configured to generate an output current $I_{OUT}$ having a magnitude that is substantially equal to a square of a difference between a first input voltage $V_{IN1}$ and a second input voltage $V_{IN2}$.

The square-function circuit 100 includes a first portion 102 and a second portion 104. Each of the first portion 102 and the second portion 104 are configured substantially similar to the square-function circuit 80 in the example of FIG. 5. The first portion 102 includes a first N-type input FET N11 having a gate that is driven by a first input voltage $V_{IN1}$ and a second N-type input FET N12 having a gate that is driven by a second input voltage $V_{IN2}$. The first portion 102 also includes a first current source 106 that conducts a bias current $I_0$ from a positive voltage $V_{DD}$ to a drain terminal of the first input FET N11. The second input FET N12 has a drain coupled to an output 110 from which the output current $I_{OUT}$ flows through the second input FET N12. The first input FETs N1 and N12 are coupled together at a source. The first portion 102 of the square-function circuit 100 also includes an N-type FET N15 that is coupled to the sources of the first and second input FETs N11 and N12 at a drain and to a low voltage at a source, demonstrated in the example of FIG. 6 as ground. The FET N15 has a gate that is coupled to the drain of the first input FET N11. Therefore, the first portion 102 includes a feedback circuit 112 that includes the first input FET N11 and the FET N15.

The second portion 104 includes a third N-type input FET N13 that is driven by the first input voltage $V_{IN2}$ at a gate and a fourth N-type input FET N14 that is driven by a second input voltage $V_{IN1}$ at a gate. The input FETs N11, N12, N13, and N14 can all be matched FETs, similar to as described above in the example of FIG. 5. The second portion 104 also includes a second current source 108 that conducts a bias current $I_0$ from a positive voltage $V_{DD}$ to drain terminals of the third input FET N13. The fourth input FET N14 has a drain coupled to an output 110 from which the output current $I_{OUT}$ flows through the fourth input FET N14. The third and fourth input FETs N13 and N14 are coupled together at a source. The second portion 104 of the square-function circuit 100 also includes an N-type FET N16 that is coupled to the sources of the third and fourth input FETs N13 and N14 at a drain and to ground. The FET N16 has a gate that is coupled to the drain of the third input FET N13. Therefore, the second portion 104 includes a feedback circuit 114 that includes the third input FET N13 and the FET 16.

Each of the first and second portions 102 and 104 of the square-function circuit 100 individually operates substantially the same as the square-function circuit 80 in the example of FIG. 5. However, the first and second portions 102 and 104 of the square-function circuit 100 collectively operate in two quadrants such that the output current $I_{OUT}$ is provided as a square of the difference between the first and second input voltages $V_{IN1}$ and $V_{IN2}$ regardless of the relative magnitude of the first and second input voltages $V_{IN1}$ and $V_{IN2}$. Specifically, upon the second input voltage $V_{IN2}$ having a magnitude that is substantially greater than the first input voltage $V_{IN1}$ (e.g., greater than a few hundred mV), the first portion 102 of the square-function circuit 100 operates to provide a current $I_{12}$ and the second portion 104 of the square-function circuit 100 is deactivated. In this mode of operation, the second input FET N12 conducts the current $I_{12}$ as equal to the output current $I_{OUT}$, such that the current $I_{12}$ is a square-function of the difference between the first and second input voltages $V_{IN1}$ and $V_{IN2}$. Upon the first input voltage $V_{IN1}$ having a magnitude that is substantially greater than the second input voltage $V_{IN2}$ (e.g., greater than a few hundred mV), the second portion 104 of the square-function circuit 100 operates to provide a current $I_{14}$ and the first portion 102 of the square-function circuit 100 is deactivated. In this mode of operation, the fourth input FET N14 conducts the current $I_{14}$ as equal to the output current $I_{OUT}$, such that the current $I_{14}$ is a square-function of the difference between the first and second input voltages $V_{IN1}$ and $V_{IN2}$.

As another example, if either of the second and fourth input FETs N12 and N14 operate in a weak inversion mode, then the output current $I_{OUT}$ is equal to a sum of the currents $I_{12}$ and $I_{14}$. For example, if an absolute value of the difference between the first and second input voltages $V_{IN1}$ and $V_{IN2}$ is substantially small (e.g., less than a few hundred mV), then each of the second and fourth input FETs N12 and N14 can operate in a weak inversion mode to conduct a portion of the output current $I_{OUT}$. In the weak inversion mode the second and fourth input FETs N12 and N14 conduct current that varies exponentially with respect to a gate/source voltage $V_{GS}$. However, the output current $I_{OUT}$, as a sum of the exponential-law current flow through each of the second and fourth input FETs N12 and N14, remains at a magnitude that is a square of a difference between the first and second input voltages $V_{IN1}$ and $V_{IN2}$, such as described above in Equations 11-14. Accordingly, although each of the second and fourth input FETs N12 and N14 can exhibit exponential dependence on the gate/source voltage $V_{GS}$ individually in the weak inversion mode, they collectively can exhibit square dependence on the difference between the first and second input voltages $V_{IN1}$ and $V_{IN2}$ to generate the output current $I_{OUT}$.

It is to be understood that the square-function circuit 100 is not intended to be limited to the example of FIG. 6. As an example, the square-function circuit 100 can be arranged such that the first through fourth input FETs N11 through N14, as well as the FETs N15 and N16, could be configured as P-type FETs, and the current sources 106 and 108 could conduct the bias current $I_0$ to ground.

Figure 7:
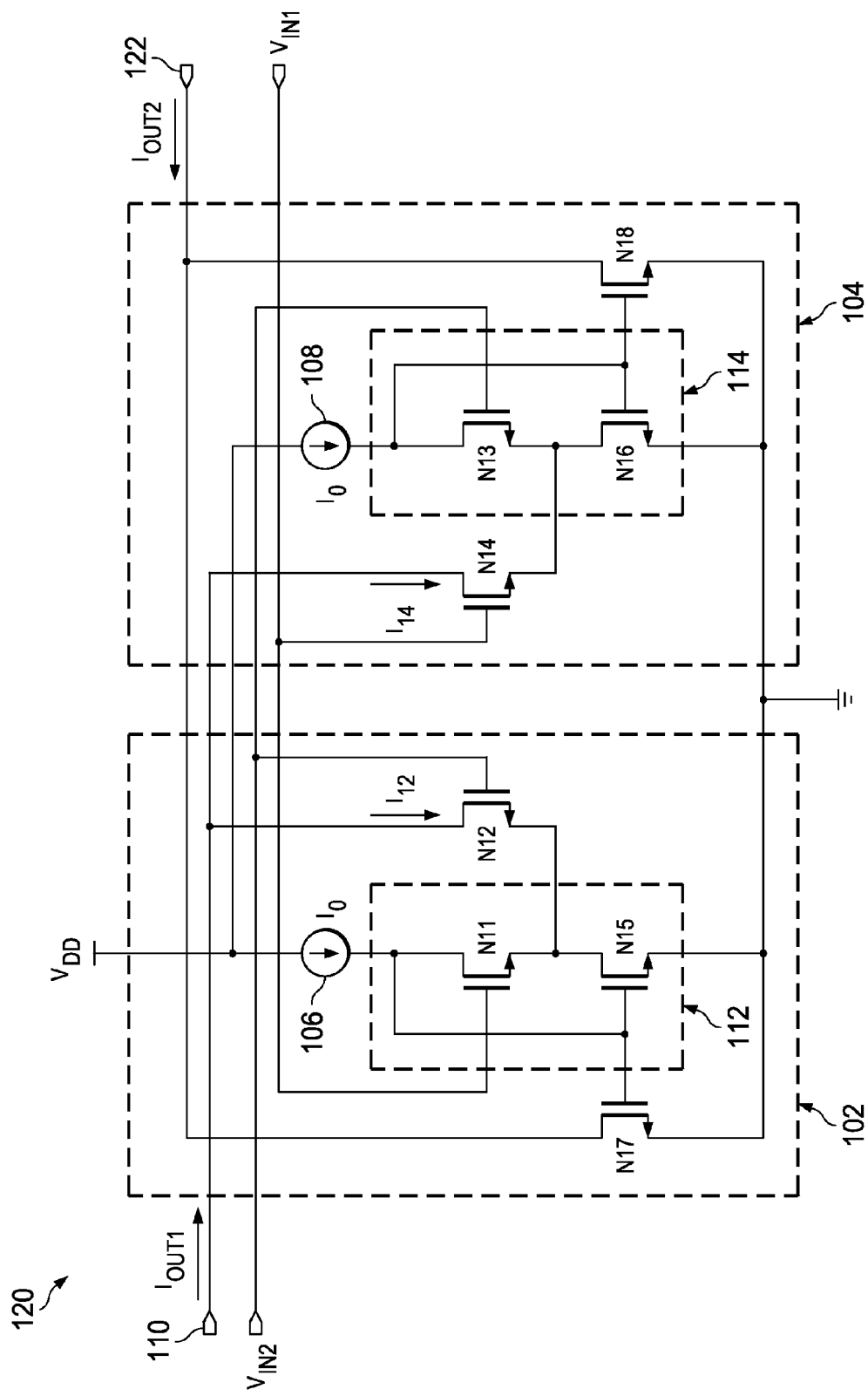
FIG. 7 illustrates yet another example of a two-quadrant square-function circuit in accordance with an aspect of the invention.

FIG. 7 illustrates a further example of a square-function circuit 120 in accordance with an aspect of the invention. The square-function circuit 120 is configured substantially similar to the square-function circuit 100 in the example of FIG. 6. Therefore, reference is to be made to the example of FIG. 6, and like reference numbers are used in the following description of the square-function circuit 120 as those described in the square-function circuit 100 in the example of FIG. 6.

The output 110 from which an output current $I_{OUT1}$ flows is a first output, the output current $I_{OUT1}$ having a magnitude that is a square-function of the difference between the first input voltage $V_{IN1}$ and the second input voltage $V_{IN2}$. The square-function circuit 120 also includes a second output 122 from which a second output current $I_{OUT2}$ flows. The first portion 102 of the square-function circuit 120 includes an FET N17 and the second portion 104 of the square-function circuit 120 includes an FET N18, each of the FETs N17 and N18 interconnect the second output 122 and ground. Thus, a first portion of the second output current $I_{OUT2}$ can flow through the FET N17 and a second portion of the second output current $I_{OUT2}$ can flow through the FET N18.

The first and second portions of the second output current $I_{OUT2}$ are proportional to the first and second portions of the first output current $I_{OUT1}$, respectively (e.g., $I_{OUT1}=I_{12}+I_{14}$). Specifically, the FET N17 is coupled at a gate to the gate of the FET N15 and the FET N18 is coupled at a gate to the gate of the FET N16. Therefore, the current that flows through the FET N15 is mirrored through the FET N17 and the current that flows through the FET N16 is mirrored through the FET N18. The magnitude of the respective portions of the second output current $I_{OUT2}$ can vary based on a size variation of the FETs N17 and N18 relative to the FETs N15 and N16. As an example, if the FETs N17 and N18 are equal in size relative to the FETs N15 and N16, then the current flow through each of the FETs N17 and N18 can be equal to the current flow through the FETs N15 and N16, respectively. Thus, the second output current $I_{OUT2}$ can have a magnitude that is substantially equal to the output current $I_{OUT1}$ plus twice the magnitude of the bias current $I_0$. Accordingly, the square-function circuit 120 in the example of FIG. 7 demonstrates a manner in which the output current $I_{OUT2}$ can be scaled and provided to a variety of loads.

It is to be understood that the square-function circuit 120 is not intended to be limited to the example of FIG. 7. As an example, the square-function circuit 120 can be substantially inverted, such that the first through fourth input FETs N11 through N14, as well as the FETs N15 through N18, could be configured as P-type FETs, and the current sources 106 and 108 could conduct the bias current $I_0$ to ground. In addition, the square-function circuit 120 is not limited to one additional output, but can include a plurality of outputs that each provides a separate output current. The output currents can have equal magnitudes or can have magnitudes that are scaled relative to each other.

Figure 8:
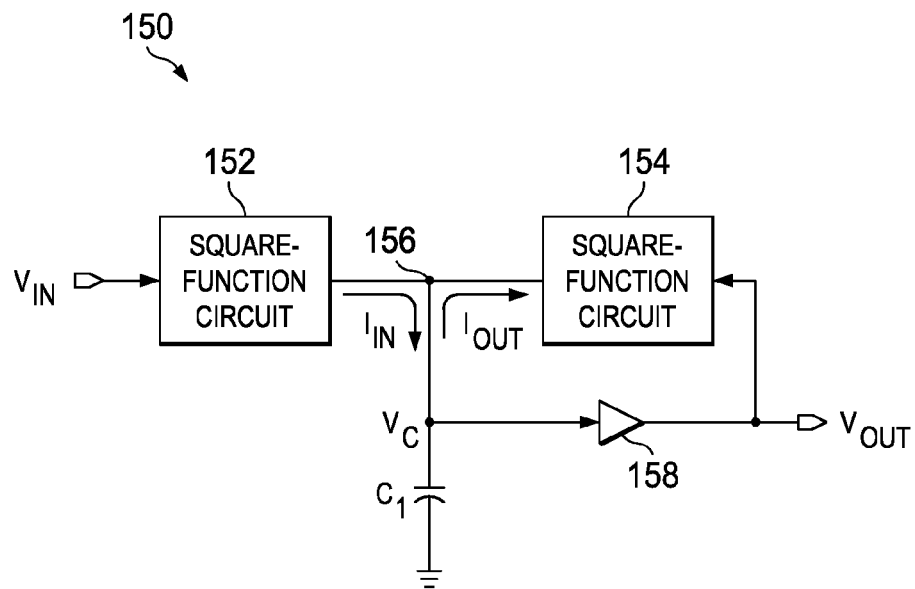
FIG. 8 illustrates an example of a power detector circuit in accordance with an aspect of the invention.

FIG. 8 illustrates an example of a power detector circuit 150 in accordance with an aspect of the invention. The power detector circuit 150 is configured to convert a root-mean-square (RMS) magnitude of an input voltage $V_{IN}$ to a DC output signal $V_{OUT}$. The power detector circuit 150 includes a first square-function circuit 152 and a second square-function circuit 154. As an example, the first and second square-function circuits 152 and 154 can be configured substantially the same, and can be configured substantially similar to any of the square-function circuits shown and described herein, including the circuits 20, 50, 80, 100, or 120 of the examples of FIGS. 2, 3, 5, 6, and 7 above, respectively.

The first square-function circuit 152 receives the input signal $V_{IN}$ as an input and generates an input current $I_{IN}$ in response. Likewise, the second square-function circuit 154 receives the output signal $V_{OUT}$ as an input and generates an output current $I_{OUT}$ in response. Therefore, the input current $I_{IN}$ has a magnitude that is a square-function of the input signal $V_{IN}$, such as having a magnitude of $(k^*V_{IN}^2)$, and the output current $I_{OUT}$ has a magnitude that is a square-function of the output signal $V_{OUT}$, such as having a magnitude of $(k^*V_{OUT}^2)$. The input current $I_{IN}$ and the output current $I_{OUT}$ are each provided to a node 156. A capacitor $C_1$ interconnects the node 156 and a low voltage, demonstrated as ground in the example of FIG. 8. The power detector circuit 150 also includes a buffer circuit 158 that is configured to buffer a voltage $V_C$ at the node 156 to generate the output voltage $V_{OUT}$.

The input and output currents $I_{IN}$ and $I_{OUT}$ are subtracted at the node 156, such that the difference between the input and output currents $I_{IN}$ and $I_{OUT}$ charges the capacitor $C_1$. The charging of the capacitor $C_1$ is described by the following expression:

$$V_{C(t)} = V_{C(0)} + \left(\frac{1}{C_1}\right)\int_0^t (I_{IN} - I_{OUT})dt \quad \text{Equation 21}$$
$$= V_{C(0)} + \left(\frac{k}{C_1}\right)\int_0^t (V_{IN}^2 - V_{OUT}^2)dt$$

Where: $V_{C(t)}$ is the voltage of the capacitor $C_1$ at a time t;
$V_{C(0)}$ is the voltage of the capacitor $C_1$ at a time 0; and
k is a constant.

Based on the interaction of the first and second square-function circuits 152 and 154, specifically with regard to the input current $I_{IN}$ and the output current $I_{OUT}$, the power detector circuit 150 operates to set an equilibrium condition associated with respect to charging and discharging the capacitor $C_1$. Specifically, the power detector circuit 150 is configured to set the output current $I_{OUT}$ to be substantially equal to the input current $I_{IN}$, such that the capacitor voltage $V_C$ remains stable. Therefore, the second term in Equation 21 is set to zero upon the power detector circuit 150 achieving the equilibrium state. Accordingly, upon the power detector circuit 150 achieving equilibrium state at a time [t, t+T], Equation 21 can be rewritten in terms of $V_{OUT}$ as follows:

$$V_{OUT} = \sqrt{\frac{1}{T}\int_t^{t+T} V_{IN}^2 dt} \quad \text{Equation 22}$$

Therefore, Equation 22 demonstrates that, for a measured input signal $V_{IN}$, the output voltage $V_{OUT}$ that balances the input current $I_{IN}$ and the output current $I_{OUT}$ at the node 156 is an RMS measurement of the input signal $V_{IN}$. Accordingly, the power detector circuit 150 provides a DC output signal based on a measured RMS magnitude of a given input signal.

Figure 9:
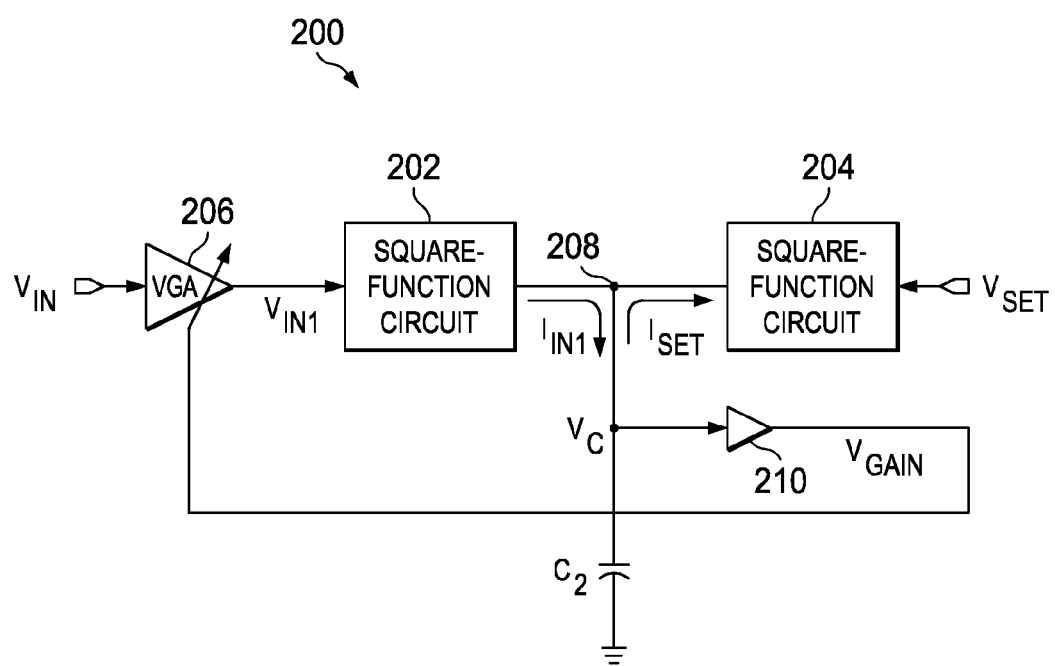
FIG. 9 illustrates an example of a power equalizer circuit in accordance with an aspect of the invention.

FIG. 9 illustrates an example of a power equalizer circuit 200 in accordance with an aspect of the invention. The power equalizer circuit 200 can be configured to monitor and equalize a received input signal $V_{IN}$, such as in a code-division multiple access (CDMA) system. For example, in a wireless CDMA base station application, the received power of each subscriber may need to be monitored and equalized. Accordingly, the power equalizer circuit 200 can be implemented in a CDMA base station application to monitor and equalize the power of each subscribing customer.

The power equalizer circuit 200 is configured similar to the power detector circuit 150 in the example of FIG. 8. Specifically, the power equalizer circuit 200 includes a first square-function circuit 202 and a second square-function circuit 204. As an example, the first and second square-function circuits 202 and 204 can be configured substantially the same, and can be configured substantially similar to any of the square-function circuits shown and described herein, including the circuits 20, 50, 80, 100, or 120 of the examples of FIGS. 2, 3, 5, 6, and 7 above, respectively.

The power equalizer circuit 200 also includes a variable gain amplifier (VGA) 206 that is configured to receive the input signal $V_{IN}$ at an input and to provide an amplified input signal $V_{IN1}$ at an output. The first square-function circuit 202 receives the amplified input signal $V_{IN1}$ as an input and generates an input current $I_{IN1}$ in response. Likewise, the second square-function circuit 204 receives a fixed reference signal $V_{SET}$ as an input and generates a current $I_{SET}$ in response. Therefore, the input current $I_{IN1}$ has a magnitude that is a square-function of the amplified input signal $V_{IN1}$, such as having a magnitude of $(k^*V_{IN1}^2)$, and the current $I_{SET}$ has a magnitude that is a square-function of the fixed reference signal $V_{SET}$, such as having a magnitude of $(k^*V_{SET}^2)$. The input current $I_{IN1}$ and the current $I_{SET}$ are each provided to a node 208. A capacitor $C_2$ interconnects the node 208 and a negative rail voltage, demonstrated as ground in the example of FIG. 9. The power equalizer circuit 200 also includes a buffer circuit 210 that is configured to buffer a voltage $V_C$ at the node 208 to generate a gain signal $V_{GAIN}$ that is provided to the VGA 206. The gain of the VGA 206 is set based on the magnitude of the gain signal $V_{GAIN}$, which is based on the magnitude of the voltage $V_C$. Specifically, the gain of the VGA 206 can be expressed based on the following expression:

$$G = G_0 \exp\left(-\frac{V_{GAIN}}{V_{SCALE}}\right) \quad \text{Equation 23}$$

Where: $G_0$ and $V_{SCALE}$ are constants.

Therefore, the gain of the VGA 206 decreases exponentially in response to a linear increase in the gain signal $V_{GAIN}$.

Similar to as described above in the example of FIG. 8, based on the interaction of the first and second square-function circuits 202 and 204, specifically with regard to the input current $I_{IN1}$ and the current $I_{SET}$, the power equalizer circuit 200 operates to set an equilibrium associated with respect to charging and discharging the capacitor $C_2$. Specifically, the power equalizer circuit 200 is configured to set the amplified input voltage $V_{IN1}$ such that the input current $I_{IN1}$ approximates the current $I_{SET}$. This equilibrium state of the input current $I_{IN1}$ and the current $I_{SET}$ being equal occurs based on the capacitor voltage $V_C$ remaining stable.

As an example, a low magnitude of the input signal $V_{IN}$ results in an initially small magnitude of the input current $I_{IN1}$ (i.e., less than the current $I_{SET}$), such as based on a wireless customer being far away from the associated base station. Therefore, the gain signal $V_{GAIN}$ is set to a low magnitude, resulting in an increased gain of the VGA 206. Accordingly, the input current $I_{IN1}$ is increased until it is about equal to the current $I_{SET}$ to balance the charging and discharging of the capacitor $C_2$. Similarly, a high magnitude of the input signal $V_{IN}$ results in an initially high magnitude of the input current $I_{IN1}$ (i.e., greater than the current $I_{SET}$), such as based on a wireless customer being within a relatively close proximity to the associated base station. Therefore, the gain signal $V_{GAIN}$ is set to a high magnitude, resulting in a decreased gain of the VGA 206. Accordingly, the input current $I_{IN1}$ is decreased until it is substantially equal to the current $I_{SET}$ to balance the charging and discharging of the capacitor $C_2$. As a result, the signal strength of separate signals from separate respective customers can all be equalized to the same power level, such that each of the signals can be coded and modulated into the same frequency channel in a CDMA communications environment.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A square-function circuit comprising:
   an input field-effect transistor (FET) having a gate that is driven by an input voltage and is configured to conduct an output current; and
   a feedback circuit coupled to a source of the input FET, the feedback circuit being configured to drive the source of the input FET based on the output current to set a magnitude of the output current to be substantially equal to a square of the input voltage.

2. The square-function circuit of claim 1, wherein the input FET is a first input FET and the input voltage is a first input voltage, the square-function circuit further comprising:
   a second input FET having a gate that is driven by a second input voltage and is configured to conduct a substantially fixed bias current, wherein the feedback circuit interconnects the first and second input FETs, the magnitude of the output current being substantially equal to a square of a difference between the first input voltage and the second input voltage.

3. The square-function circuit of claim 2, wherein the feedback circuit further comprises:
   an operational transconductance amplifier having a first input coupled to the source of the first input FET, a second input of the operational transconductance amplifier being coupled to a source of the second input FET; and
   a third FET having a source coupled to the source of the first input FET and a gate coupled to an output of the operational transconductance amplifier, the third FET and the operational transconductance amplifier operating to set a source voltage at the source of the first input FET substantially equal to a voltage at the source of the second input FET.

4. The square-function circuit of claim 2, wherein the feedback circuit further comprises:
   a current source configured to conduct the substantially fixed bias current through the second input FET, and
   a third FET having a gate coupled to a drain of the second input FET, the first input FET having a source that is coupled to a source of the second input FET, such that the third FET is operated to maintain current flow through the third FET that is substantially equal to a sum of the substantially fixed bias current and the output current.

5. The square-function circuit of claim 1, wherein the feedback circuit is a first feedback circuit, the input FET is a first input FET, and the input voltage is a first input voltage, the first input FET being configured to conduct a first output current therethrough substantially equal to a square of a difference between the first input voltage and the second input voltage, the first output current being conducted through the first input FET in response to the first input voltage being greater than the second input voltage, the square-function circuit further comprising:
   a second input FET having a gate that is driven by the second input voltage to provide a second current therethrough;
   a second feedback circuit that is configured to drive a source of the second input FET such that a magnitude of the second current is substantially equal to a square of a difference between the second input voltage and the first input voltage in response to the second input voltage being greater than the first input voltage, and
   a resulting output current being provided at an output of the square-function circuit as a sum of the first current and the second current.

6. The square-function circuit of claim 5, the square-function circuit further comprising:
   a first current mirror coupled to the first feedback circuit and configured to conduct a portion of a second output current based on current through the first feedback circuit; and
   a second current mirror coupled to the second feedback circuit and configured to conduct a remaining portion of the second output current based on current through the second feedback circuit, the second output current having a magnitude that is proportional to the resulting output current.

7. The square-function circuit of claim 5, further comprising:
   a third FET having a gate that is driven by the second input voltage, the third FET being configured to conduct a first substantially fixed bias current therethrough to set a source voltage of the third FET and thereby drive the source of the first input FET; and
   a fourth FET having a gate that is driven by the first input voltage, the fourth FET being configured to conduct a second substantially fixed bias current therethrough to set a source voltage of the fourth FET and thereby drive the source of the second input FET;
   wherein the first input FET is configured to conduct a first output current therethrough in response to the first input voltage being greater than the second input voltage by a threshold magnitude, wherein the second input FET is configured to conduct a second output current therethrough in response to the second input voltage being greater than the first input voltage by the threshold magnitude, and wherein the output current is provided at an output of the square-function circuit as a sum of the first output current and the second output current and is substantially equal to a square a difference between the first and second input voltages.

8. One of a power detector, a power equalizer, and a frequency doubler comprising at least one of the square-function circuit of claim 1.

9. A square-function circuit comprising:
   a first field-effect transistor (FET) configured to conduct a bias current in response to a first input voltage to set a source voltage of the first FET;
   a second FET configured to conduct an output current in response to a second input voltage; and
   a feedback loop coupled to a source of the first FET and coupled to a source of the second FET, the feedback loop configured to drive the source of the second FET to control the output current to have a magnitude that is a square of a difference between the second input voltage and the first input voltage.

10. The square-function circuit of claim 9, wherein the feedback loop is configured to set a source voltage of the second FET to be substantially equal to a source voltage of the first FET to set the magnitude of the output current to be substantially independent of a threshold voltage for the second FET.

11. The square-function circuit of claim 10, wherein the first FET and the second FET are substantially matched FETs in which a threshold voltage of the first FET is substantially equal to the threshold voltage of the second FET.

12. The square-function circuit of claim 9, wherein the feedback loop further comprises:
   an operational transconductance amplifier having a first input coupled to a source of the first FET and a second input coupled to a source of the second FET; and
   a third FET having a source coupled to the source of the second FET and a gate coupled to an output of the operational transconductance amplifier, the third FET and the operational transconductance amplifier operating to set a source voltage at the source of the second FET substantially equal to a voltage at the source of the first FET, an output impedance of the operational transconductance amplifier being less than an input impedance at the source of the second FET.

13. The square-function circuit of claim 12, wherein the third FET is a P-type FET and each of the first and second FETs is an N-type FET.

14. The square-function circuit of claim 9, wherein the feedback loop further comprises:
   a current source configured to conduct the bias current through the first FET as a substantially fixed current, and
   a third FET having a gate coupled to a drain of the first FET, a drain of the third FET being coupled to having a source of the second FET and to a source of the first FET.

15. The square-function circuit of claim 14, wherein the feedback loop is configured to bias the third FET based on the output current to maintain current through the third FET that is substantially equal to a sum of the bias current and the output current.

16. The square-function circuit of claim 15, wherein the feedback loop is a first feedback loop and the second input FET is configured to conduct at least a portion of the output current in response to a difference between the second input voltage and the first input voltage being within a threshold voltage, the square-function circuit further comprising:
   a fourth FET configured to conduct the bias current in response to the second input voltage; and
   a fifth FET coupled to the fourth FET via a second feedback loop, the fifth FET being configured to conduct a remaining portion of the output current according to the first input voltage applied at a gate thereof.

17. The square-function circuit of claim 16,
   wherein each of the second FET and the fourth FET is coupled to an output of the square-function circuit, the second FET being configured to conduct the output current therethrough the second FET while the difference between the second input voltage and the first input voltage is greater than the threshold voltage, and
   the fifth FET is configured to conduct the output current therethrough the fifth FET while a difference between the first input voltage and the second input voltage is greater than the threshold voltage.

18. A square-function circuit comprising:
   a first circuit portion comprising
      a first field-effect transistor (FET) configured to conduct a first bias current in response to a first input voltage applied at a gate thereof, and
      a second FET having a source voltage that is set based at least in part on the first bias current, the second FET being configured to conduct a first current through the second FET in response to a second input voltage, which is applied at a gate thereof, being greater than the first input voltage; and
   a second circuit portion comprising:
      a third FET configured to conduct a second bias current in response to the second input voltage applied at a gate thereof, and
      a fourth FET having a source voltage that is set based at least in part on the second bias current, the fourth FET being configured to conduct a second current through the fourth FET in response to the first input voltage being greater than the second input voltage;
   wherein an output current is provided at a first output of the square-function circuit as a sum of the first current and the second current, and the output current having a magnitude that is substantially equal to a square of a difference between the first input voltage and the second input voltage.

19. The square-function circuit of claim 18, wherein each of the first circuit portion and the second circuit portion comprises a feedback circuit configured to set the source voltage of each of the second FET and the fourth FET at a magnitude that is substantially equal to a magnitude of a source voltage of each of the first FET and the third FET, respectively, such that the output current is provided substantially independently of a threshold voltage associated with at least the second FET and the fourth FET.

20. The square-function circuit of claim 19, further comprising:

a first current mirror coupled to the feedback circuit of the first circuit portion and configured to conduct a third current that is proportional to the first current in response to the second input voltage being greater than or substantially equal to the first input voltage; and a second current mirror coupled to the feedback circuit of the second circuit portion and configured to conduct a fourth current that is proportional to the second current in response to the first input voltage being greater than or substantially equal to the second input voltage, the third current and the fourth current being summed at a second output of the square-function circuit to provide a second output current over a range of the first input voltage and the second input voltage.

* * * * *